(12) United States Patent
Jeong et al.

(10) Patent No.: US 10,460,883 B2
(45) Date of Patent: Oct. 29, 2019

(54) MULTILAYER ELECTRONIC COMPONENT AND BOARD HAVING THE SAME

(71) Applicant: SAMSUNG ELECTRO-MECHANICS CO., LTD., Suwon-si (KR)

(72) Inventors: In Wha Jeong, Suwon-si (KR); Jae Suk Sung, Suwon-si (KR); Hugh Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/003,222

(22) Filed: Jun. 8, 2018

(65) Prior Publication Data

US 2018/0294107 A1    Oct. 11, 2018

Related U.S. Application Data

(63) Continuation of application No. 15/065,932, filed on Mar. 10, 2016, now Pat. No. 10,062,523.

(30) Foreign Application Priority Data

Sep. 4, 2015    (KR) .................. 10-2015-0125669

(51) Int. Cl.
*H05K 1/18*    (2006.01)
*H01G 15/00*    (2013.01)
(Continued)

(52) U.S. Cl.
CPC ............ *H01G 15/00* (2013.01); *H01G 2/06* (2013.01); *H01G 4/012* (2013.01); *H01G 4/232* (2013.01);
(Continued)

(58) Field of Classification Search
CPC ...................................................... H01G 4/30
(Continued)

(56) References Cited

U.S. PATENT DOCUMENTS

| 6,587,020 B2 | 7/2003 | Tojyo |
| 7,660,100 B2 * | 2/2010 | Togashi ............... H01G 4/012 361/301.2 |

(Continued)

FOREIGN PATENT DOCUMENTS

| CN | 1764992 A | 4/2006 |
| CN | 101471179 A | 7/2009 |

(Continued)

OTHER PUBLICATIONS

Chinese Office Action dated May 28, 2019 in counterpart Chinese Patent Application No. 201610197323.3 (13 pages in English and 10 pages in Chinese).

*Primary Examiner* — Stanley Tso
(74) *Attorney, Agent, or Firm* — NSIP Law

(57) ABSTRACT

A multilayer electronic component includes a ceramic body having stacked dielectric layers to form a first capacitor part and a second capacitor part, wherein the first capacitor has a constant capacitance, and the second capacitor part has a variable capacitance; a voltage control terminal formed on a lateral surface of the ceramic body; an input terminal disposed on another lateral surface of the ceramic body corresponding to the first capacitor part; and an output terminal disposed on the other lateral surface of the ceramic body corresponding to the second capacitor part separate from the input terminal.

15 Claims, 9 Drawing Sheets

(51) Int. Cl.
    *H01G 4/30*    (2006.01)
    *H01G 7/06*    (2006.01)
    *H01G 2/06*    (2006.01)
    *H01G 4/012*    (2006.01)
    *H01G 4/232*    (2006.01)

(52) U.S. Cl.
    CPC ............... *H01G 4/30* (2013.01); *H01G 7/06* (2013.01); *H05K 1/18* (2013.01)

(58) Field of Classification Search
    USPC .......................................................... 174/260
    See application file for complete search history.

(56) References Cited

U.S. PATENT DOCUMENTS

| | | | |
|---|---|---|---|
| 8,059,387 | B2 | 11/2011 | Yoon et al. |
| 8,184,425 | B2 | 5/2012 | Lee et al. |
| 8,922,975 | B2 | 12/2014 | Kim |
| 9,041,491 | B2 | 5/2015 | Sato et al. |
| 9,087,643 | B1 * | 7/2015 | Nishibayashi ......... H01G 4/005 |
| 9,425,760 | B2 | 8/2016 | Lee |
| 2006/0158824 | A1 | 7/2006 | Kawajiri et al. |
| 2008/0012654 | A1 | 1/2008 | Han et al. |
| 2009/0168298 | A1 | 7/2009 | Togashi |
| 2009/0207553 | A1 | 8/2009 | Togashi |
| 2010/0290173 | A1 | 11/2010 | Yoon et al. |
| 2012/0112855 | A1 | 5/2012 | Sato et al. |
| 2014/0285944 | A1 | 9/2014 | Sato |
| 2015/0021076 | A1 | 1/2015 | Lee |
| 2015/0326109 | A1 | 11/2015 | Fuji |

FOREIGN PATENT DOCUMENTS

| | | |
|---|---|---|
| CN | 101510463 A | 8/2009 |
| CN | 102473525 A | 5/2012 |
| CN | 103890884 A | 6/2014 |
| KR | 10-2008-0006983 A | 1/2008 |
| KR | 10-2015-0011270 A | 1/2015 |

\* cited by examiner

MULTILAYER ELECTRONIC COMPONENT AND BOARD HAVING THE SAME

CROSS-REFERENCE TO RELATED APPLICATIONS

This application is a continuation of U.S. application Ser. No. 15/065,932 filed on Mar. 10, 2016, which claims the benefit under 35 USC 119(a) of Korean Patent Application No. 10-2015-0125669 filed on Sep. 4, 2015, with the Korean Intellectual Property Office, the entire disclosures of each of which are incorporated herein by reference for all purposes.

BACKGROUND

1. Field

The following description relates to a multilayer electronic component and a board having the same.

2. Description of Related Art

Currently, a prominent technical trend in the area of devices such as power modules and communications modules is system integration. In accordance with the miniaturization of and implementation of high levels of performance in electronic devices, a driving frequency of devices, such as power modules and communications modules, has been gradually increased, and thus, a technology allowing for high levels of integration in circuit components, including active elements and passive elements, has been developed.

In accordance with this trend, demand for high-voltage, high-capacitance multilayer ceramic capacitors (MLCCs) has increased. In particular, multilayer ceramic capacitors (MLCCs) having various levels of capacitance are desired in order to realize a platform of a highly integrated power module. However, most MLCCs are manufactured in a state in which capacitance thereof is standardized, such that MLCCs according to the related art only provide limited capacitance.

For example, in the case of existing MLCCs, it is difficult to implement a specific capacitance with just one MLCC. Therefore, one MLCC may be used, or two or more MLCCs may be used in series or in parallel, depending on the amount of capacitance required in an application to which the MLCC is applied.

However, in most cases, a specific capacitance required for an application may not be satisfied. Particularly, because operational characteristics of the overall power module may be significantly altered by a small capacitance error under a high-frequency operating conditions, demand for a variable MLCC having a variable capacitance has increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a multilayer electronic component includes a ceramic body having stacked dielectric layers to form a first capacitor part and a second capacitor part, wherein the first capacitor has a constant capacitance, and the second capacitor part has a variable capacitance; a voltage control terminal formed on a lateral surface of the ceramic body; an input terminal disposed on another lateral surface of the ceramic body corresponding to the first capacitor part; and an output terminal disposed on the other lateral surface of the ceramic body corresponding to the second capacitor part separate from the input terminal.

The first capacitor part may include first and second internal electrodes disposed on the dielectric layers, wherein the first internal electrodes are electrically connected to the voltage control terminal and the second internal electrodes are electrically connected to the input terminal.

The second capacitor part may include third and fourth internal electrodes disposed on the dielectric layers, wherein the third internal electrodes are electrically connected to the voltage control terminal and the fourth internal electrodes are electrically connected to the output terminal.

A number of stacked first and second internal electrodes may be the same as a number of stacked third and fourth internal electrodes or different from a number of stacked third and fourth internal electrodes.

The first capacitor part may have a same thickness as the second capacitor part or a different thickness than the second capacitor part.

The voltage control terminal may include a first body portion disposed on the lateral surface of the ceramic body and a first band portion extending from the first body portion towards the other lateral surface.

The input terminal may include a second body portion disposed on an upper portion of the other lateral surface of the ceramic body and a second band portion extending from the second body portion towards the lateral surface of the ceramic body. The output terminal may include a third body portion disposed on a lower portion of the other lateral surface of the ceramic body and a third band portion extending from the third body portion towards the lateral surface of the ceramic.

A buffer layer, having a dielectric material, may be disposed between the first capacitor part and the second capacitor part.

An insulating part disposed may be between the input terminal and the output terminal on the other lateral surface of the ceramic body.

In another general aspect, a board having a multilayer electronic component, includes a circuit board; first and second electrode pads disposed on the circuit board at a predetermined interval; and a multilayer electronic component. The multilayer electronic component includes a ceramic body having stacked dielectric layers to form a first capacitor part and a second capacitor part, wherein the first capacitor has a constant capacitance, and the second capacitor part has a variable capacitance; a voltage control terminal formed on a lateral surface of the ceramic body; an input terminal disposed on another lateral surface of the ceramic body corresponding to the first capacitor part; and an output terminal disposed on the other lateral surface of the ceramic body corresponding to the second capacitor part separate from the input terminal. The multilayer electronic component is mounted on the circuit board connecting the voltage control terminal and the output terminal to the first and second electrode pads, respectively.

The first capacitor part of the board may include first and second internal electrodes disposed on the dielectric layers, wherein the first internal electrodes are electrically connected to the voltage control terminal and the second internal electrodes are electrically connected to the input terminal.

The second capacitor part of the board may include third and fourth internal electrodes disposed on the dielectric layers, wherein the third internal electrodes are electrically connected to the voltage control terminal and the fourth internal electrodes are electrically connected to the output terminal.

The input terminal of the board may include a second body portion disposed on an upper portion of the other lateral surface of the ceramic body and a second band portion extending from the second body portion towards the lateral surface of the ceramic body, and the output terminal comprises a third body portion disposed on a lower portion of the other lateral surface of the ceramic body and a third band portion extending from the third body portion towards the lateral surface of the ceramic.

A buffer layer having a dielectric material may be disposed between the first capacitor part and the second capacitor part.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
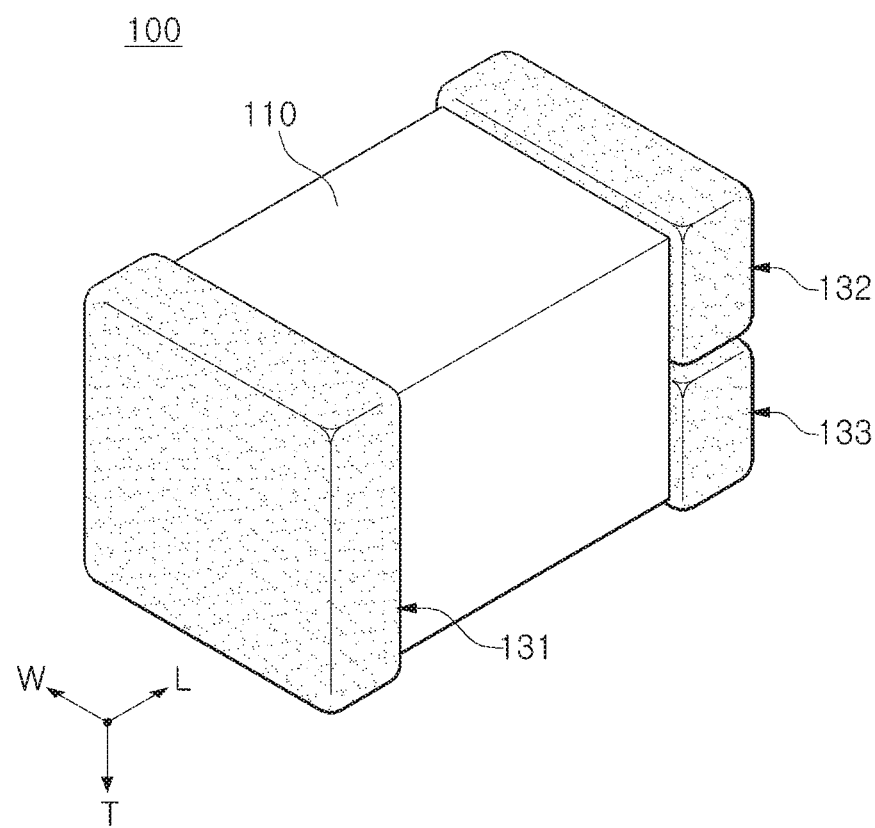
FIG. 1 is a perspective diagram schematically illustrating a multilayer ceramic capacitor according to an embodiment.
Figure 2:
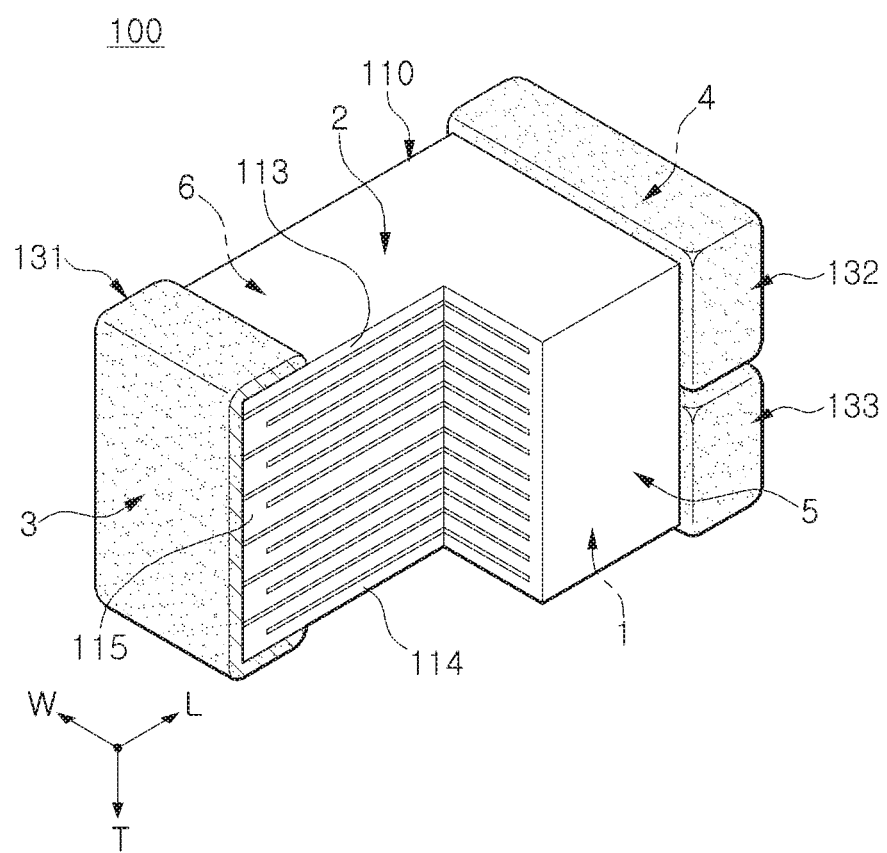
FIG. 2 is a cut-away perspective diagram schematically illustrating a part of FIG. 1.
Figure 3:
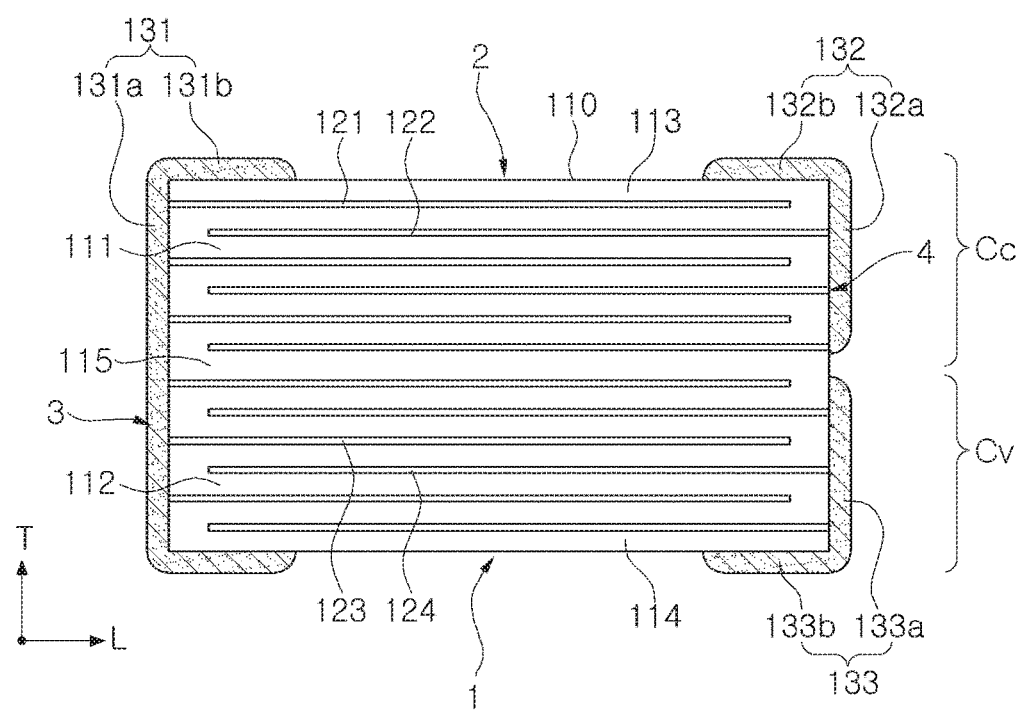
FIG. 3 is a cross-sectional diagram of FIG. 1.
Figure 4:
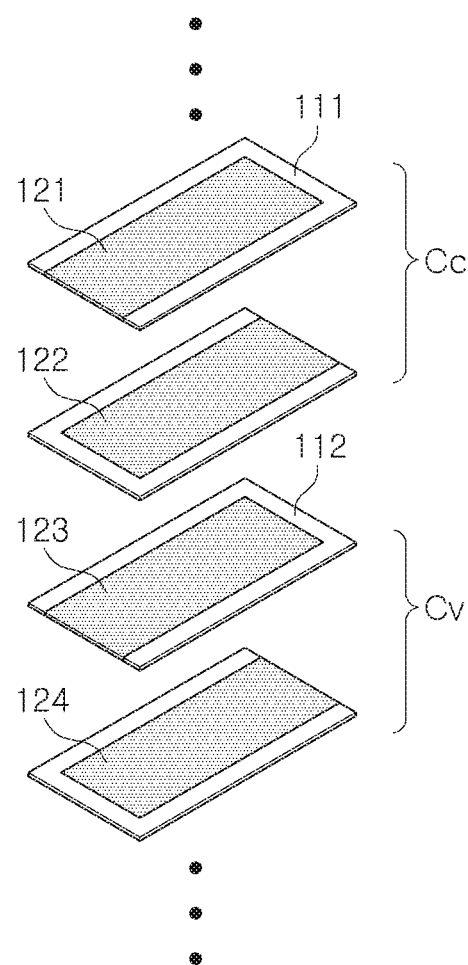
FIG. 4 is a separated perspective diagram illustrating a stacking structure of internal electrodes of the multilayer ceramic capacitor of FIG. 1.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, a multilayer electronic component according to an embodiment, particularly, a multilayer ceramic capacitor will be described, but the multilayer electronic component is not limited thereto.

In addition, directions of a ceramic body will be defined in order to clearly describe exemplary embodiments in the present disclosure. L, W and T illustrated in the accompanying drawings refer to a length direction (L), a width direction (W), and a thickness direction (T), respectively. Here, the thickness direction is the same as a stacking direction in which dielectric layers are stacked.

Referring to FIGS. 1 through 4, a multilayer capacitor 100 according to an embodiment includes a ceramic body 110; a voltage control terminal 131, an input terminal 132, and an output terminal 133.

The ceramic body 110 is formed by stacking first and second dielectric layers 111 and 112 along the thickness direction T and then sintering the stacked first and second dielectric layers, and adjacent first or second dielectric layers 111 or 112 may be integrated so that boundaries therebetween are not readily apparent without a scanning electron microscope (SEM). Internal electrodes are formed on each of the first and second dielectric layers 111 and 112. A shape of the ceramic body 110 is not particularly limited, but may be, for example, hexahedral.

Further, in the present embodiment, for convenience of explanation, upper and lower surfaces of the ceramic body 110 will be defined as first and second surfaces 1 and 2. Both surfaces of the ceramic body 110 extending within W-T plane are defined as third and fourth surfaces 3 and 4, and both surfaces of the ceramic body 110 extending within the L-T plane are defined as fifth and sixth surfaces 5 and 6.

The first or second dielectric layer 111 or 112 contains a ceramic material having high permittivity, such as a barium titanate ($BaTiO_3$)-based ceramic powder. However, the material of the first and second dielectric layers 111 and 112 is not limited thereto as long as sufficient capacitance may be obtained. In addition, the first or second dielectric layer 111 or 112 may further contain various ceramic additives such as transition metal oxides or carbides, a rare earth element, magnesium (Mg), aluminum (Al) or other metals, an organic solvent, a plasticizer, a binder, or a dispersant, or any combination thereof, in addition to the ceramic powder, in order to obtain a desired capacitance. Although the first and second dielectric layers 111 and 112 may be formed of the same material, the first and second dielectric layers 111 and 112 are not limited thereto. If necessary, the first dielectric layer may be formed of different materials from those of the second dielectric layer.

The ceramic body 110 includes a first capacitor part $C_c$ positioned in an upper portion thereof, having constant capacitance, and a second capacitor part $C_v$ positioned in a lower portion thereof and having variable capacitance. In this case, the first and second capacitor parts may have the same thickness or different thicknesses as needed.

In addition, a buffer layer 115 on which an internal electrode is not formed is interposed between the first and second capacitor parts, and cover layers 113 and 114 are disposed on upper and lower portions of the ceramic body 110 in the thickness direction. The buffer layer 115 and the cover layers 113 and 114 have the same structure as the first or second dielectric layer 111 or 112 of the first or second capacitor part $C_v$ except that the internal electrode is not formed thereon.

First and second internal electrodes 121 and 122 of the first capacitor part, which are electrodes having different polarities from each other, are alternately disposed to face each other with respective ceramic sheets forming the first dielectric layer 111 interposed therebetween. A lateral end portion of the first internal electrode 121 and a lateral end portion of the second internal electrode 122 is exposed to the third surface 3 and the fourth surfaces 4 of the ceramic body 110, respectively. Here, the first and second internal electrodes 121 and 122 are electrically insulated from each other by the first dielectric layer 111 interposed therebetween.

Third and fourth internal electrodes 123 and 124 of the second capacitor part, which are electrodes having different polarities from each other, are alternately disposed to face each other with respective ceramic sheets forming the second dielectric layer 112 interposed therebetween. A lateral end portion of the third internal electrode 123 and a lateral end portion of the fourth internal electrode 124 is exposed to the third surface 3 and the fourth surface 4 of the ceramic body 110, respectively. Here, the third and fourth internal electrodes 123 and 124 are electrically insulated from each other by the second dielectric layer 112 interposed therebetween.

In addition, the first to fourth internal electrodes 121 to 124 are formed of a conductive metal, for example, silver (Ag), palladium (Pd), platinum (Pt), nickel (Ni), and copper (Cu), or any combination thereof. However, the material of the first to fourth internal electrodes 121 to 124 is not limited thereto. Further, the first to fourth internal electrodes 121 to 124 may be formed by printing a conductive paste on the first or second dielectric layer 111 or 112. In this case, as a printing method, a screen printing method, or a gravure printing method, may be used. However, the printing method is not limited thereto. Additionally, the number of stacked first and second internal electrodes 121 and 122 and the number of stacked third and fourth internal electrodes 123 and 124 may be the same as or different from each other, as desired.

The voltage control terminal 131 is formed on the third surface 3 of the ceramic body 110. The voltage control terminal 131 includes a first body portion 131a and a first band portion 131b. The first body portion 131a is a portion formed on the third surface 3 of the ceramic body 110. The first body portion 131a is electrically connected to the lateral end portions of the first and third internal electrodes 121 and 123 exposed to the third surface 3 of the ceramic body 110 to thereby be connected to the first and second capacitor parts in series.

The first band portion 131b is a band portion extending from the first body portion 131a along the first and second surfaces 1 and 2 and along the fifth and sixth surfaces 5 and 6 of the ceramic body 110. The first band portion 131b serves as a mounting surface of the multilayer capacitor 100 and increases adhesive strength of the voltage control terminal 131 to the ceramic body 110.

The input terminal 132 is disposed in a location corresponding to that of the first capacitor part $C_c$ on the fourth surface 4 of the ceramic body 110. The input terminal 132 includes a second body portion 132a and a second band portion 132b. The second body portion 132a is formed on an upper portion of the fourth surface 4 of the ceramic body 110 (towards the second surface 2). The second body portion 132a is electrically connected to the lateral end portions of the second internal electrodes 122 exposed to the fourth surface 4 of the ceramic body 110.

The second band portion 132b is a band portion extending from the second body portion 132a along a portion of the second surface 2 and portions of the fifth and sixth surfaces 5 and 6 of the ceramic body 110. The second band portion 132b serves as the mounting surface of the multilayer capacitor 100 and increases adhesive strength of the input terminal 132 to the ceramic body 110.

The output terminal 133 disposed at a location of the fourth surface 4 of the ceramic body corresponding to the second capacitor part. The output terminal 133 includes a third body portion 133a and a third band portion 133b.

The third body portion 133a is a portion formed on a lower portion of the fourth surface 4 of the ceramic body 110 (towards the first surface 1). The third body portion 133a is electrically connected to end portions of the fourth internal electrodes 124 exposed to the fourth surface 4 of the ceramic body 110.

The third band portion 133b is a band portion extending from the third body portion 133a along a portion of the first surface 1 and portions of the fifth and sixth surfaces 5 and 6 of the ceramic body 110. The third band portion 133b serves as the mounting surface of the multilayer capacitor 100 and increases adhesive strength of the output terminal 133 to the ceramic body 110.

In addition, the voltage control terminal 131, the input terminal 132, and the output terminal 133 are formed of a conductive metal, for example, silver (Ag), nickel (Ni), copper (Cu), or any combination thereof. The voltage control terminal 131, the input terminal 132, and the output terminal 133, as described above, may be formed by applying a conductive paste prepared by adding glass frit to a conductive metal powder and then sintering the applied conductive paste, but the method of forming the voltage control terminal 131, the input terminal 132, and the output terminal 133 is not limited thereto. Further, plating layers may be formed on the voltage control terminal 131, the input terminal 132, and the output terminal 133, respectively. The plating layers increase adhesive strength between the multilayer capacitor 100 and a circuit board at the time of mounting the multilayer capacitor 100 onto a circuit board using solder. The plating layers may include, for example, nickel (Ni) plating layers formed on the voltage control terminal 131, the input terminal 132, and the output terminal 133, respectively, and tin (Sn) plating layers formed on the nickel plating layers, but the plating layers are not limited thereto.

In the multilayer capacitor according to an embodiment, the internal electrodes are disposed using a serial connection method, such that the multilayer capacitor may operate as a structure in which two multilayer ceramic capacitors (MLCCs) are equivalently connected to each other in series.

Figure 5:
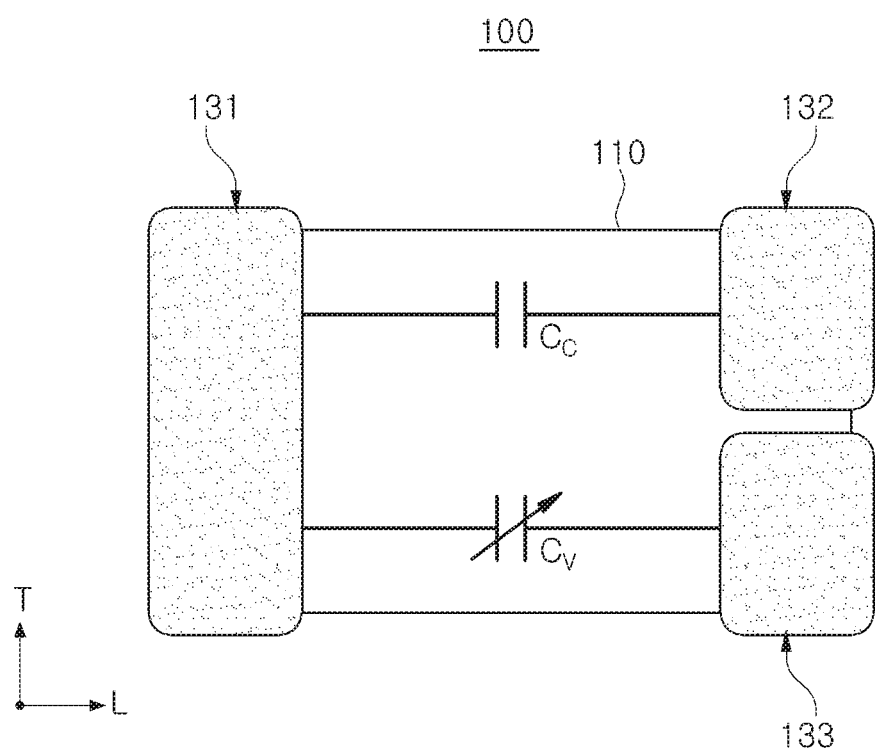
FIG. 5 is a circuit configuration diagram of the multilayer ceramic capacitor of FIG. 1.

Referring to FIG. 5, in the multilayer capacitor 100, the first capacitor part $C_c$ having a constant capacitance $C_C$, and the second capacitor part $C_v$ having a variable capacitance $C_V$, are connected to each other in series. The first capacitor part $C_c$ includes the first and second electrodes 121 and 122. The second capacitor part $C_v$ includes the third and fourth internal electrodes 123 and 124. A voltage Vcon is applied to the third and fourth internal electrodes 123 and 124 to control the variable capacitance of the second capacitor part $C_v$. A total capacitance $C_T$ between the input terminal 132 and the output terminal 133 may be represented by the following Equation 1.

$$C_T = \frac{C_v \cdot C_c}{C_v + C_c} \quad \text{[Equation 1]}$$

For example, when a control voltage Vcon applied to the voltage control terminal 131 is increased, the capacitance $C_V$ of the third and fourth internal electrodes 123 and 124 decreases proportionately or decreases according to variation rates by a floating voltage increased in a lower leg. In this case, the total capacitance $C_T$ is similarly decreased according to Equation 1. Here, the constant capacitance $C_C$ is larger than the variable capacitance $C_V$.

Therefore, since the multilayer capacitor as described above implements various levels of capacitance by only changing the control voltage Vcon, a flexible circuit and a platform may be realized with a high degree of freedom.

The multilayer capacitor automatically implements a self-balanced control function even in a case in which there is no input applied to the voltage control terminal 131, that is, there is no external control voltage.

For example, in a case in which a $V_{Cc}$ voltage is increased by a specific cause as in a case in which a level of capacitance of the first capacitor part $C_C$ having constant capacitance is changed, since a floating voltage applied to a low-side leg of the second capacitor part $C_V$ is increased, the capacitance of the second capacitor part $C_V$ is decreased, and thus, the $V_{Cc}$ voltage may be always maintained as a constant and stable. In other words, the second capacitor part Cv varies to maintain the capacitance of the first capacitor part Cc. For example, in conventional MLCC, a level of capacitance of the MLCC is significantly affected depending on a change in temperature. However, in the multilayer capacitor 100, constant capacitance or constant bias voltage $V_{Cc}$ of the multilayer capacitor is always implemented, as illustrated in the following Equation 2.

$$V_{Cc} = \frac{C_v}{C_v + C_c} \cdot VDD \quad \text{[Equation 2]}$$

Figure 6:
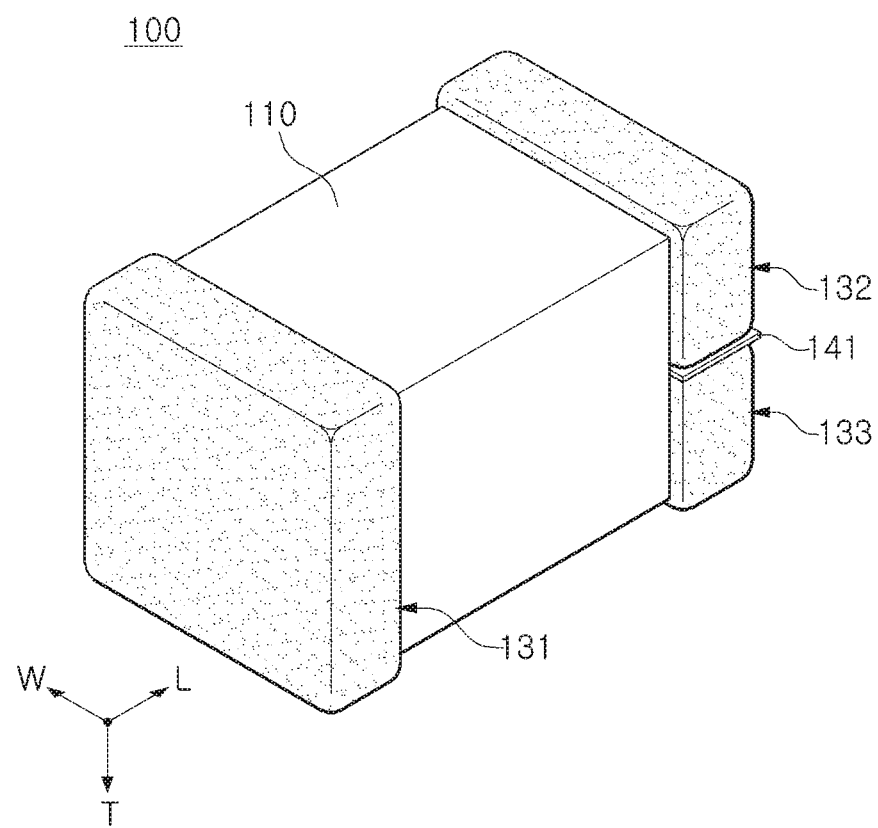
FIG. 6 is a perspective diagram schematically illustrating a multilayer ceramic capacitor according to another embodiment in the present disclosure.
Figure 7:
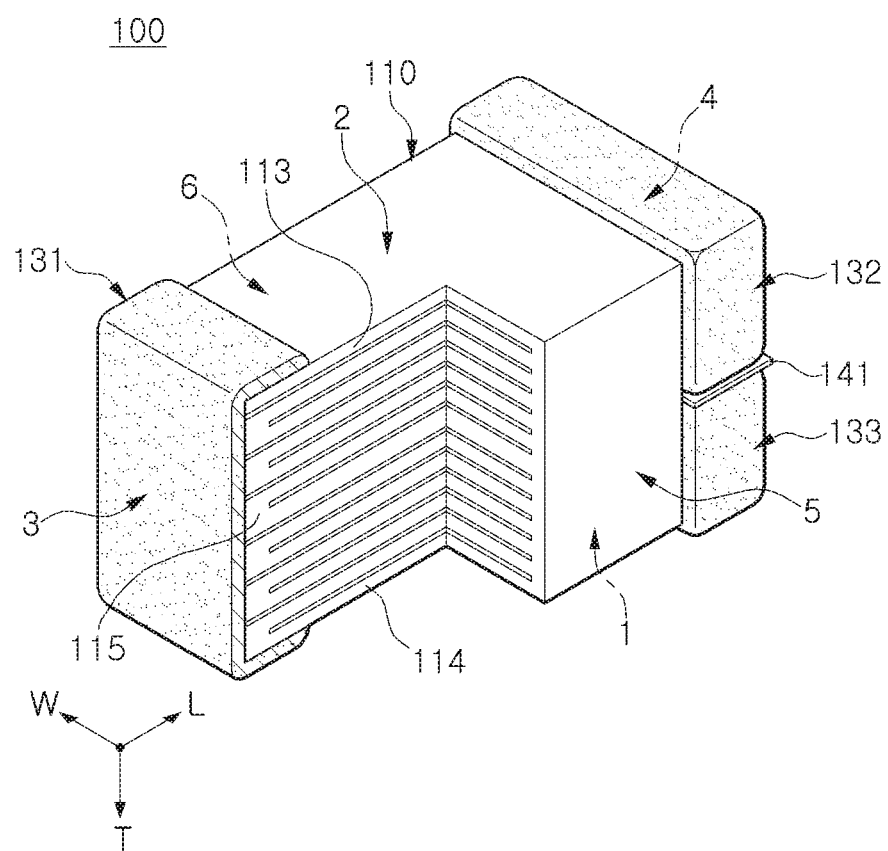
FIG. 7 is a cut-away perspective diagram schematically illustrating a part of FIG. 6.

Referring to FIGS. 6 and 7, an insulating part 141 is disposed on a fourth surface 4 of a ceramic body 110 between the input and output terminals 132 and 133. The insulating part 141 improves insulation between the input and output terminals 132 and 133.

Figure 8:
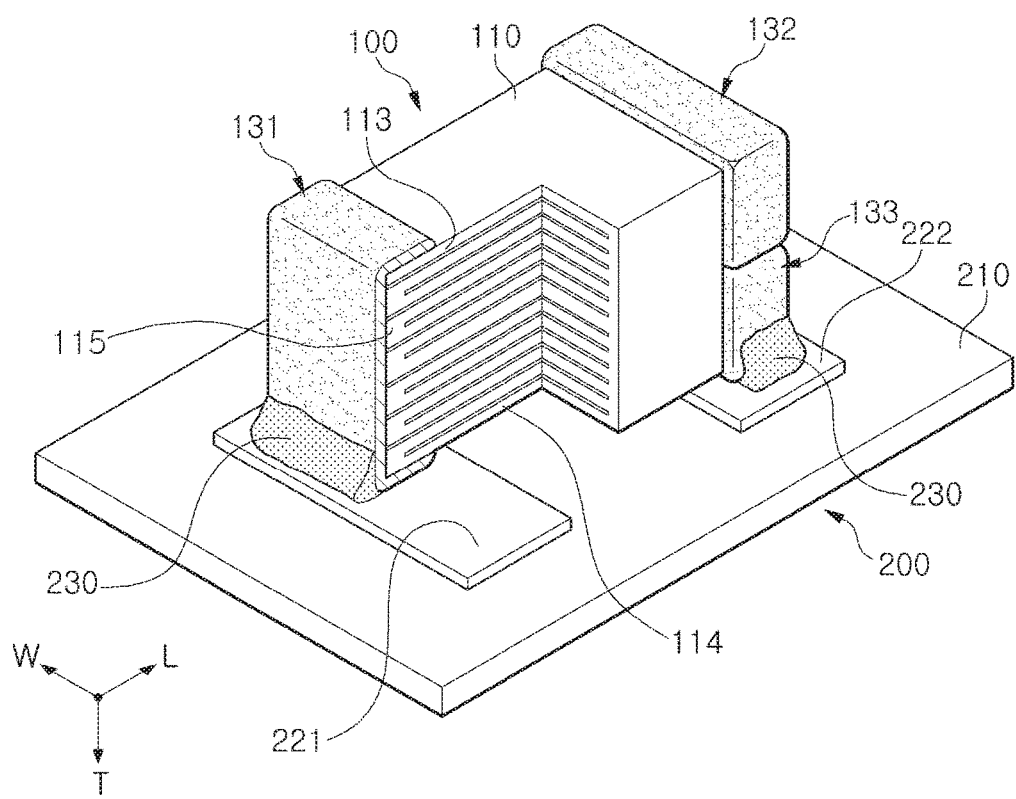
FIG. 8 is a perspective diagram schematically illustrating a board in which the multilayer ceramic capacitor according to an embodiment is mounted on a circuit board.
Figure 9:
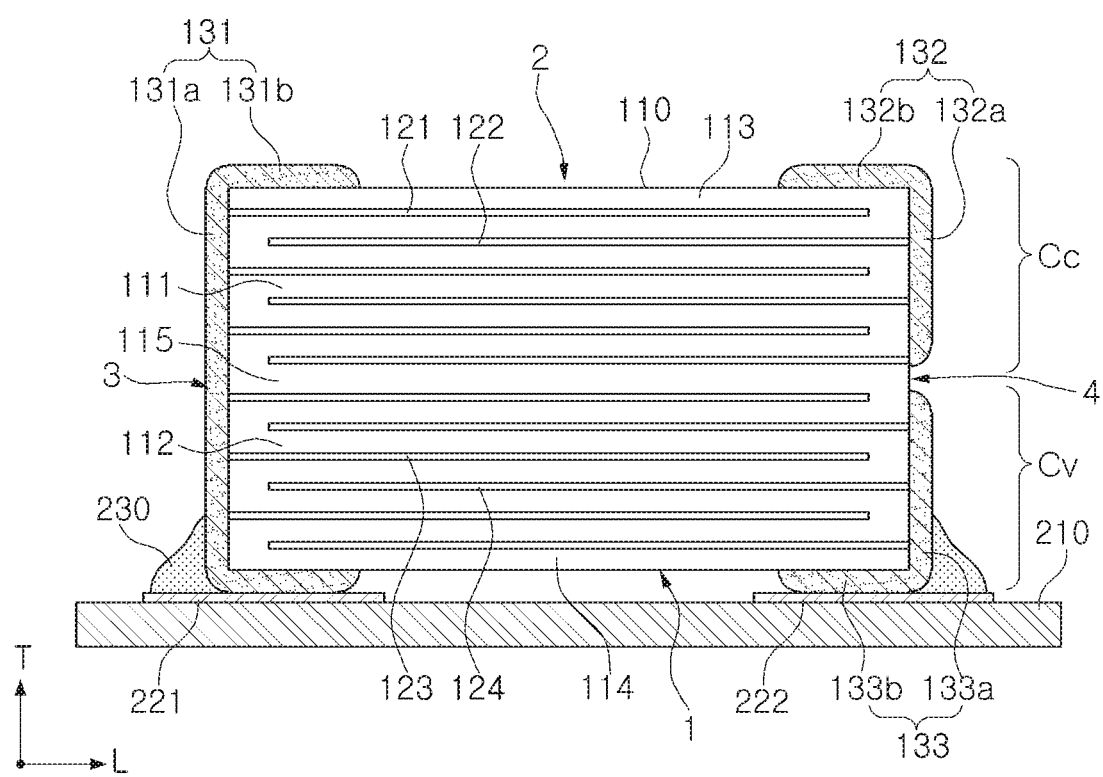
FIG. 9 is a cross-sectional diagram of FIG. 8.

Referring to FIGS. 8 and 9, a multilayer capacitor 100 is disposed on a board 200. The board 200 includes a circuit board 210 and first and second electrode pads 221 and 222. The multilayer capacitor 100 is mounted on the circuit board 210 so that the first surface 1 of the ceramic body 110 faces an upper surface of the circuit board 210.

The first and second electrode pads 221 and 222 are formed on the upper surface of the circuit board 210. The first and second electrode pads 221 and 222 are formed in locations on the upper surface of the circuit board 210 corresponding to the voltage control terminal 131 and the output terminal 133 of the multilayer capacitor, respectively. Therefore, the multilayer capacitor 100 is electrically connected to the circuit board 210 through solder 230 in a state in which the first band portion 131b of the voltage control terminal 131 and the third band portion 133b of the output terminal 133 are positioned to contact the first and second electrode pads 221 and 222, respectively.

As set forth above, according to one or more embodiments in the present disclosure, an arbitrary capacitance required in various applications is provided using a single component, and a flexible circuit with a high degree of freedom and a platform of a high-integration and high frequency power module is achieved.

As a non-exhaustive example only, a device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayer electronic component comprising:
   a ceramic body comprising stacked dielectric layers, each layer extending in a first direction and a second direction orthogonal to the first direction, stacked in a third direction orthogonal to the first direction and the second direction, to form a first capacitor part stacked in the third direction on a second capacitor part, wherein a buffer layer separates the first capacitor part from the second capacitor part;
   a voltage control terminal formed on a lateral surface on a first end of the ceramic body in the first direction;
   an input terminal disposed on another lateral surface on an opposite end of the ceramic body in the first direction, and corresponding to the first capacitor part; and
   an output terminal disposed on the other lateral surface on the opposite end of the ceramic body, corresponding to the second capacitor part, and separated from the input terminal in the third direction by a thickness of the buffer layer,
   wherein the first capacitor part comprises first and second internal electrodes disposed on the dielectric layers, the first internal electrodes are electrically connected to the voltage control terminal, and the second internal electrodes are electrically connected to the input terminal,
   wherein the second capacitor part comprises third and fourth internal electrodes disposed on the dielectric layers, the third internal electrodes are electrically connected to the voltage control terminal, and the fourth internal electrodes are electrically connected to the output terminal, and
   wherein the first and second internal electrodes have constant capacitance, and the third and fourth internal electrodes have variable capacitance.

2. The multilayer electronic component of claim 1, wherein a number of stacked first and second internal electrodes is the same as a number of stacked third and fourth internal electrodes.

3. The multilayer electronic component of claim 1, wherein a number of stacked first and second internal electrodes is different from a number of stacked third and fourth internal electrodes.

4. The multilayer electronic component of claim 1, wherein the first capacitor part has a same thickness as the second capacitor part.

5. The multilayer electronic component of claim 1, wherein the first capacitor part has a different thickness than the second capacitor part.

6. The multilayer electronic component of claim 1, wherein the voltage control terminal comprises a first body portion disposed on the lateral surface on the first end of the ceramic body in the first direction and a first band portion extending from the first body portion onto a first surface of the ceramic body that extends in the first and second directions.

7. The multilayer electronic component of claim 1, wherein the input terminal comprises a second body portion disposed on a first portion of the other lateral surface of the ceramic body and a second band portion extending from the second body portion onto the first surface of the ceramic body that extends in the first and second directions,
   the output terminal comprises a third body portion disposed on a second portion of the other lateral surface of the ceramic body and a third band portion extending from the third body portion onto a second external surface of the ceramic body that extends in the first and second directions, and
   the first portion of the other lateral surface is separated from the second portion of the other lateral surface in the third direction.

8. The multilayer electronic component of claim 1, wherein the buffer layer comprising a dielectric material is disposed between the first capacitor part and the second capacitor part.

9. The multilayer electronic component of claim 1, further comprising an insulating part disposed between the input terminal and the output terminal on the other lateral surface of the ceramic body.

10. A board having a multilayer electronic component, the board comprising:
    a circuit board;
    first and second electrode pads disposed on the circuit board at a predetermined interval; and
    a multilayer electronic component comprising:
      a ceramic body comprising stacked dielectric layers, each layer extending in a first direction and a second direction orthogonal to the first direction, stacked in a third direction orthogonal to the first direction and the second direction, to form a first capacitor part stacked in the third direction on a second capacitor part, wherein a buffer layer separates the first capacitor part from the second capacitor part;
      a voltage control terminal formed on a lateral surface on a first end of the ceramic body in the first direction;
      an input terminal disposed on another lateral surface on an opposite end of the ceramic body in the first direction and corresponding to the first capacitor part; and
      an output terminal disposed on the other lateral surface on the opposite end of the ceramic body, corresponding to the second capacitor part, and separated from the input terminal in the third direction by a thickness of the buffer layer,
      wherein the first capacitor part comprises first and second internal electrodes disposed on the dielectric layers, wherein the first internal electrodes are electrically connected to the voltage control terminal and the second internal electrodes are electrically connected to the input terminal,
      wherein the second capacitor part comprises third and fourth internal electrodes disposed on the dielectric layers, wherein the third internal electrodes are electrically connected to the voltage control terminal and the fourth internal electrodes are electrically connected to the output terminal,
      wherein the first capacitor part has constant capacitance, and the second capacitor part has variable capacitance, and wherein the multilayer electronic component is mounted on the circuit board connecting the voltage control terminal and the output terminal to the first and second electrode pads, respectively.

11. The board of claim 10, wherein the input terminal comprises a second body portion disposed on a first portion of the other lateral surface of the ceramic body and a second band portion extending from the second body portion onto a first external surface of the ceramic body that extends in the first and second directions,
the output terminal comprises a third body portion disposed on a second portion of the other lateral surface of the ceramic body and a third band portion extending from the third body portion onto a second external surface of the ceramic body that extends in the first and second directions, and
the first portion of the other lateral surface is separated in the third direction from the second portion.

12. The board of claim 10, wherein the buffer layer comprising a dielectric material is disposed between the first capacitor part and the second capacitor part.

13. The board of claim 10, wherein the voltage control terminal comprises a first body portion formed on the lateral surface on the first end of the ceramic body, a first band portion extending from the first body portion onto the first external surface, and a fourth band portion extending from the first body portion onto the second external surface.

14. A multilayer electronic component comprising:
a ceramic body comprising planar dielectric layers and planar electrode layers alternating in a stacking direction, and a planar buffer layer, each of the planar layers extending in a first direction and a second direction, and the stacking direction is orthogonal to the first direction and the second direction;
a voltage control terminal on a first lateral end surface of the ceramic body in the first direction,
an input terminal disposed on a first portion of a second lateral end surface of the ceramic body opposite to the first lateral end surface in the first direction; and
an output terminal disposed on a second portion of the second lateral end surface of the ceramic body and separate from the input terminal,
wherein
the planar electrode layers comprise terminal electrodes interleaved alternately with control electrodes in the stacking direction,
the control electrodes are connected to the voltage control terminal,
the terminal electrodes comprise input electrodes and output electrodes,
the input electrodes are connected to the input terminal,
the output electrodes are connected to the output terminal, and
the first portion and the second portion of the second lateral end surface are separated from each other in the third direction by a thickness of the buffer layer, and
wherein the planar electrode layers of the first portion have constant capacitance, and the planar electrode layers of the second portion have variable capacitance.

15. The multilayer electronic component of claim 14, wherein
the input electrodes are consecutive terminal electrodes in the stacking direction,
the output electrodes are consecutive terminal electrodes in the stacking direction, and
the input electrodes are separate from the output electrodes in the stacking direction.

* * * * *